US010355170B2

(12) United States Patent
Weiss

(10) Patent No.: US 10,355,170 B2
(45) Date of Patent: Jul. 16, 2019

(54) OPTOELECTRONIC SEMICONDUCTOR COMPONENT

(71) Applicant: OSRAM Opto Semiconductors GmbH, Regensburg (DE)

(72) Inventor: Guido Weiss, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/507,752

(22) PCT Filed: Aug. 21, 2015

(86) PCT No.: PCT/EP2015/069281
§ 371 (c)(1),
(2) Date: Feb. 28, 2017

(87) PCT Pub. No.: WO2016/034445
PCT Pub. Date: Mar. 10, 2016

(65) Prior Publication Data
US 2017/0288094 A1  Oct. 5, 2017

(30) Foreign Application Priority Data

Sep. 1, 2014  (DE) .................. 10 2014 112 562

(51) Int. Cl.
*H01L 33/08* (2010.01)
*H01L 33/14* (2010.01)
(Continued)

(52) U.S. Cl.
CPC ............ *H01L 33/382* (2013.01); *H01L 33/24* (2013.01); *H01L 33/38* (2013.01)

(58) Field of Classification Search
CPC ..... H01L 33/382; H01L 33/24; H01L 31/042; H01L 31/046; H01L 31/047;
(Continued)

(56) References Cited

U.S. PATENT DOCUMENTS 8,564,006 B2 * 10/2013 Tachibana ............. H01L 29/045
257/100
8,975,098 B2 * 3/2015 Matsumura ............. H01L 33/40
257/13

(Continued)

FOREIGN PATENT DOCUMENTS

CN          1913186 A     2/2007
CN        102569580 A     7/2012
(Continued)

OTHER PUBLICATIONS

2nd Office Action, dated Feb. 19, 2019 for Chinese Application No. 201580046913.X.

*Primary Examiner* — Natalia A Gondarenko
(74) *Attorney, Agent, or Firm* — McDermott Will & Emery LLP

(57) ABSTRACT

Disclosed is an optoelectronic semiconductor component (1) comprising a semiconductor member (2) that has a succession of semiconductor layers including an active region (20) for generating radiation, a first semiconductor layer (21), and a second semiconductor layer (22). The active region is located between the first semiconductor layer and the second semiconductor layer; the semiconductor member has a plurality of cavities (25) which extend through the second semiconductor layer and the active region; and from a bird's eye view onto the semiconductor member, the cavities are elongate and have a longitudinal axis (250).

13 Claims, 2 Drawing Sheets

(51) Int. Cl.
*H01L 33/18* (2010.01)
*H01L 33/36* (2010.01)
*H01L 33/38* (2010.01)
*H01L 31/00* (2006.01)
*H01L 31/0224* (2006.01)
*H01L 31/0236* (2006.01)
*H01L 31/0352* (2006.01)
*H01L 33/24* (2010.01)

(58) Field of Classification Search
CPC ............ H01L 31/0475; H01L 31/1035; H01L 31/022433; H01L 31/022441–022458; H01L 31/022466; H01L 31/035281; H01L 31/0392; H01L 33/0037; H01L 33/22; H01L 33/36; H01L 33/40; H01L 33/44; H01L 33/48–648; H01L 33/62; H01L 27/1446; H01L 27/15; H01L 27/153; H01L 27/156; H01L 27/32; H01L 2933/0016; H01L 2933/0033; H01L 2933/005; H01L 2933/0066–0091; H01L 21/28; H01L 21/302–30621; H01L 21/3205; H01L 21/44; H01L 21/46; H01L 21/461; H01L 21/467; H01L 21/4803–481; H01L 21/52; H01L 21/76877; H01L 33/007; H01L 33/02; H01L 33/18; H01L 33/38; H01L 33/385; H01L 33/387; H01L 31/0352

USPC .............. 257/98, 99, 81, 778, 89, 100, 103, 257/E33.001, E33.072, E33.023, E31.059; 438/26, 28, 34, 39, 108, 46
See application file for complete search history.

(56) References Cited

U.S. PATENT DOCUMENTS

| | | | |
|---|---|---|---|
| 2011/0233581 A1* | 9/2011 | Sills | H01L 33/06 257/98 |
| 2012/0043572 A1* | 2/2012 | Engl | H01L 33/382 257/98 |
| 2014/0024150 A1 | 1/2014 | Matsumura et al. | |
| 2014/0239341 A1 | 8/2014 | Matsumura | |

FOREIGN PATENT DOCUMENTS

| | | |
|---|---|---|
| DE | 10 2007 022 947 A1 | 10/2008 |
| DE | 102008011848 A1 | 9/2009 |
| DE | 10 2008 051 048 A1 | 4/2010 |
| DE | 102009023849 A1 | 12/2010 |
| TW | 200835002 A | 8/2008 |
| TW | 201246626 A1 | 11/2012 |
| TW | 201336121 A1 | 9/2013 |

* cited by examiner

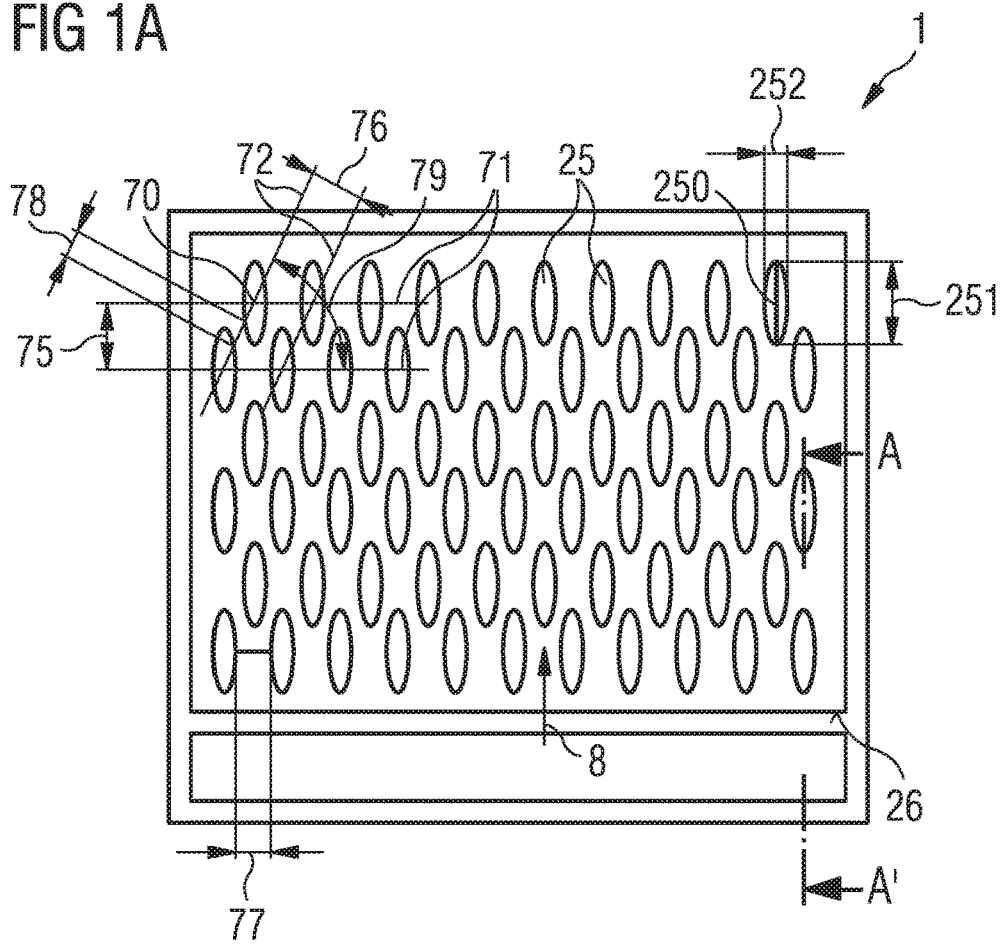
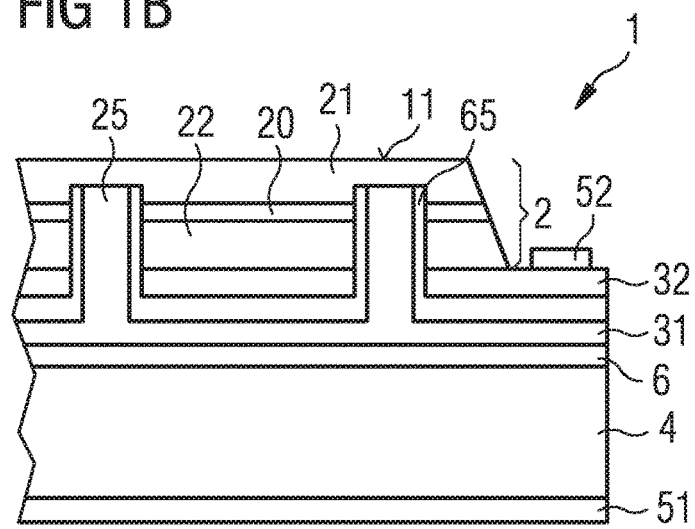

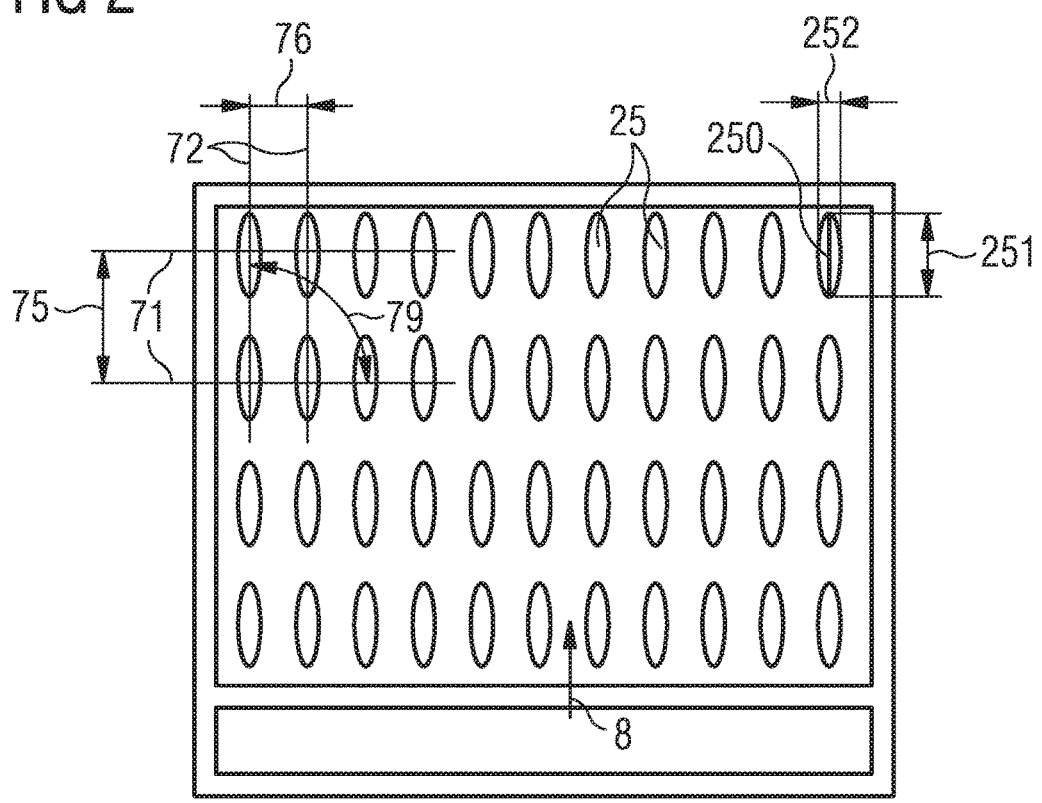

OPTOELECTRONIC SEMICONDUCTOR COMPONENT

The present application relates to an optoelectronic semiconductor component.

The efficient operation of optoelectronic semiconductor components such as light emitting diodes (LEDs) requires an efficient injection of charge carriers of both polarities, namely electrons and holes. In particular if charge carriers of both polarities are supplied from the same side of the semiconductor component, the enlargement of the connecting surface for one polarity may be at the expense of the connecting surface for the other polarity.

One object of the invention is to provide a semiconductor component, in which the charge carriers of both polarities can be injected efficiently.

This object is, inter alia, achieved by an optoelectronic semiconductor component according to claim 1. Further embodiments and developments are the subject matter of the dependent claims.

According to at least one embodiment of the optoelectronic semiconductor component, the semiconductor component comprises a semiconductor body with a semiconductor layer sequence. For example, the semiconductor layer sequence is deposited epitaxially, by means of MOVPE, for example. In particular, the semiconductor layer sequence forms the semiconductor body. The semiconductor layer sequence comprises an active region provided for the generation of radiation.

For example, the active region is provided for generating radiation in the ultraviolet, visible, or infrared spectral range. For example, the active region is arranged between a first semiconductor layer and a second semiconductor layer, wherein the first semiconductor layer and the second semiconductor layer differ, for example, at least in some regions with respect to their conductivity type such that the active region is positioned in a pn-junction. For example, the semiconductor component comprises a first contact for externally electrically contacting the first semiconductor layer and a second contact for externally electrically contacting the second semiconductor layer. A radiation exit surface extending parallel to the active region of the semiconductor body is, in particular, free from the first contact and the second contact.

According to at least one embodiment of the optoelectronic semiconductor component, the semiconductor component comprises a plurality of recesses extending through the second semiconductor layer and the active region. In particular, the recesses are provided for electrically contacting the first semiconductor layer. The recesses may end in the first semiconductor layer or completely extend through the first semiconductor layer. The recesses are arranged in the type of a lattice across the semiconductor component in a lateral direction, i.e. along a main extension plane of the semiconductor layers of the semiconductor body.

According to at least one embodiment of the optoelectronic semiconductor component, the recesses are, in a plan view of the semiconductor body, formed in an elongated manner with a longitudinal extension axis. The longitudinal extension axis is considered the direction along which the recesses have the largest extension in the lateral direction. Along the longitudinal extension axis, the recesses have a maximum longitudinal extension. Perpendicularly to the longitudinal extension axis, the recesses have a maximum transversal extension which is smaller than the longitudinal extension. Thus, in a plan view, the recesses are not circular. The recesses have an oval basic form, such as an elliptic basic form, or a polygonal basic form, or a polygonal basic form with rounded corners, for example.

In at least one embodiment of the optoelectronic semiconductor component, the semiconductor component comprises a semiconductor body, which comprises a semiconductor layer sequence with an active region provided for the generation of radiation, a first semiconductor layer and a second semiconductor layer. The active region is arranged between the first semiconductor layer and the second semiconductor layer. The semiconductor body comprises a plurality of recesses extending through the first semiconductor layer and the active region. In a plan view of the semiconductor body, the recesses are formed in an elongated manner with a longitudinal extension axis.

The larger the maximum longitudinal extension, the larger can be the area of the recesses and therefore the area in the recesses available for contacting the first semiconductor layer. Simultaneously, with the same center distance of the recesses, an outer distance between neighboring recesses transversely to the longitudinal extension axis may be greater the smaller the transversal extension is. The outer distance of two recesses along one direction is considered the distance between the outer peripheries of neighboring recesses along the respective direction. The greater the outer distance in a transversal direction, the more efficiently the second semiconductor layer can be contacted.

According to at least one embodiment of the optoelectronic semiconductor component, a ratio of the maximum longitudinal extension and the maximum transversal extension is between 1.1:1 and 10:1, for example between including 1.5:1 and including 8:1, for example between including 1.5:1 and including 3:1. It has been shown that a ratio in this range is especially suitable for an efficient charge carrier injection of electrons and holes.

According to at least one embodiment of the optoelectronic semiconductor component, the semiconductor component comprises a first connection layer, which is guided through the recesses and is electrically conductively connected to the first semiconductor layer. For example, the first connection layer in each case buts against the first semiconductor layer in the recesses. In particular, a charge carrier injection may be effected from the first contact into the first semiconductor layer via the first connection layer.

According to at least one embodiment of the optoelectronic semiconductor component, the semiconductor component comprises a second connection layer, which is electrically conductively connected to the second semiconductor layer. The second connection layer buts against the second semiconductor layer for example between the recesses. In particular, the second connection layer is provided for an evenly distributed charge carrier injection into the second semiconductor layer in the lateral direction. For example, a lateral current flow in the second semiconductor layer has a preferred current direction. For example, the second connection layer is electrically conductively connected to the second contact, wherein the second contact is arranged laterally with respect to the semiconductor body. In a plan view of the semiconductor component, the semiconductor body and the second contact are arranged next to one another without overlapping. In this case, the preferred current direction extends perpendicularly to the side surface of the semiconductor body located closest to the second contact.

According to at least one embodiment of the optoelectronic semiconductor component, the preferred lateral current direction extends parallel to the longitudinal extension axis in the second connection layer. In other words, the longitudinal extension axis of the recesses extends perpendicularly to a side surface of semiconductor body located closest to the second contact. The terms "parallel" and "perpendicular" also include slight deviations from an exactly parallel or perpendicular arrangement, for example a deviation of at most 10°.

It has been shown that the lateral current flow along the preferred lateral current direction is less disturbed by elongated recesses than by circular recesses, which are, in transversal direction, arranged at the same distance to one another and have the same area in a plan view of the semiconductor component.

According to at least one embodiment of the optoelectronic semiconductor component, the semiconductor component comprises a carrier with the semiconductor body arranged thereon. In particular, the carrier differs from the growth substrate for the semiconductor layer sequence of the semiconductor body. In particular, the carrier serves for mechanically stabilizing the semiconductor body such that the growth substrate is no longer required and can be removed during the manufacturing process. A semiconductor chip with the growth substrate removed is also referred to as a thin-film semiconductor chip. For example, the semiconductor body is attached to the carrier by means of a joining layer, for example a solder layer or an in particular electrically-conductive adhesive layer. The first connection layer extends, in particular in some regions, between the semiconductor body and the carrier. For example, the second connection layer extends, in some regions, between the first connection layer and the semiconductor body. Thus, in a plan view of the semiconductor body, the first connection layer and the second connection layer overlap in some places.

According to at least one embodiment of the optoelectronic semiconductor component, the recesses are, at least approximately, arranged on intersection points of first straight lines, which extend parallel with respect to one another along a first direction, and second straight lines, which extend parallel to one another other along a second direction. "At least approximately on intersection points" means that the area centers of the recesses are located exactly on the intersection points or that the centers of area are located at a distance of at most 20% of the distance of neighboring first straight lines from the intersection points. Preferably, the first straight lines and/or the second straight lines each extend equidistantly to one other.

According to at least one embodiment of the optoelectronic semiconductor component, a first outer distance between neighboring recesses along the first direction is greater than a second outer distance along the second direction. By having a most large first outer distance, the lateral current injection into the second semiconductor layer, in particular the lateral current flow along the preferred current direction, may be promoted. In particular, in a sectional view of the semiconductor component, the cross-section of the second connection layer can be increased between neighboring recesses without having to enlarge the layer thickness of the second connection layer.

According to at least one embodiment of the optoelectronic semiconductor component, the first outer distance along the first direction is between including 0.2 times and including five times, for example between including 0.5 times and including three times, the maximum transversal extension of the recesses. This promotes an efficient charge carrier injection for both polarities.

According to at least one embodiment of the optoelectronic semiconductor component, the first straight lines run at a first distance to one another and the second straight lines run at a second distance to one another, wherein the first straight lines extend at a greater angle to the longitudinal extension axis than the second straight lines and the first distance is greater than the second distance. This further promotes an efficient charge carrier injection into the second semiconductor layer. For example, the first distance is at least 1.1 times greater than the second distance.

According to at least one embodiment of the optoelectronic semiconductor component, an angle between the first straight lines and the second straight lines is between including 40° and including 90°. Particularly depending on the ratio between the maximum longitudinal extension and the maximum transversal extension of the recesses, the angle can be varied in this range such that an especially efficient charge carrier injection for charge carriers of both polarities is achieved.

According to at least one embodiment of the optoelectronic semiconductor component, the maximum longitudinal extension is between including 0.2 times and including 0.8 times the first distance of the first straight lines. The larger the maximum longitudinal extension, the larger can be the distance of the first straight lines.

According to at least one embodiment of the optoelectronic semiconductor component, the angle between the first straight lines and the second straight lines is 90°. With an angle of 90°, the recesses are arranged in an orthogonal lattice.

According to at least one embodiment of the optoelectronic semiconductor component, the angle between the first straight lines and the second straight lines is between including 50° and including 80°. With an angle of 60°, the recesses are arranged in a regular hexagonal lattice. With a regular hexagonal lattice, the maximum distance to the closest intersection point is smaller than in an orthogonal lattice having the same center-to-center distance of the recesses. This promotes a homogenous charge carrier injection into the first semiconductor layer in the lateral direction.

An angle of less than 60° results in a hexagonal lattice compressed perpendicularly to the first direction. The maximum distance to the closest recess is thereby further reduced.

With an angle of more than 60°, the hexagonal lattice is stretched perpendicularly to the first direction. This reduces the number of recesses per area. The area available for electrically contacting the second semiconductor layer is thereby increased.

According to at least one embodiment of the optoelectronic semiconductor component, the semiconductor component comprises a first connection layer, which is guided through the recesses and which is electrically conductively connected to the first semiconductor layer. The semiconductor component comprises a second connection layer, which is electrically conductively connected to the second semiconductor layer. A preferred lateral current direction in the second connection layer extends parallel to the longitudinal extension axis. The semiconductor body is arranged on a carrier of the semiconductor component and the first connection layer extends, in some regions, between the semiconductor body and the carrier. The recesses are arranged at least approximately in a hexagonal lattice stretched along the longitudinal extension axis.

Such a design is especially suitable for an efficient charge carrier injection for electrons and holes, wherein the charge carrier injection for both polarities is effected from the side of the semiconductor body that faces the carrier.

Further embodiments and developments result from the following description of the exemplary embodiments in conjunction with the drawings.

The figures show in:

FIGS. 1A and 1B a first exemplary embodiment for an optoelectronic semiconductor component in a schematic plan view (FIG. 1A) and a sectional view along the line AA' (FIG. 1B); and FIG. 2 a second exemplary embodiment of a semiconductor component in a schematic plan view.

Like, similar or equivalent elements are referred to with the same reference numerals in the figures.

The figures are in each case schematic illustrations and thus not made to scale. Comparatively small elements and in particular layer thicknesses may rather be shown in exaggerated size for a better understanding.

FIG. 1A shows a first exemplary embodiment of an optoelectronic semiconductor component 1 in a schematic plan view. FIG. 1B shows an associated schematic sectional view of a detail along the line AA'.

The optoelectronic semiconductor component 1 comprises a semiconductor body 2 with a semiconductor layer sequence. The semiconductor layer sequence of the semiconductor body includes an active region 20 arranged between a first semiconductor layer 21 of a first conductivity type and a second semiconductor layer 22 of a second conductivity type different from the first conductivity type. For example, the first semiconductor layer 21 is n-conductive and the second semiconductor layer 22 is p-conductive or vice versa.

The semiconductor body 2, in particularly the active region 20, preferably contains a III-V semiconductor compound material. III-V semiconductor compound materials are especially suitable for generating radiation ranging from the ultraviolet ($Al_x In_y Ga_{1-x-y} N$) and the visible ($Al_x In_y Ga_{1-x-y} N$, in particular for blue to green radiation, or $Al_x In_y Ga_{1-x-y} P$, in particular for yellow to red radiation) to the infrared ($Al_x In_y Ga_{1-x-y} As$) spectral range. In each case, $0 \leq x \leq 1$, $0 \leq y \leq 1$ and $x+y \leq 1$ applies, in particular with $x \neq 1$, $y \neq 1$, $x \neq 0$ and/or $y \neq 0$. III-V semiconductor compound materials, in particular made of the mentioned material systems, may further achieve high internal quantum efficiencies during the generation of radiation.

The semiconductor component 1 is designed as a thin film semiconductor chip. A growth substrate for epitaxially depositing the semiconductor layer sequence of the semiconductor body 2 is removed. The semiconductor body 2 is attached to a carrier 4 by means of a joining layer 6. The carrier 4 thus differs from a growth substrate for the semiconductor layer sequence and serves to mechanically stabilize the semiconductor body.

The optoelectronic semiconductor component 1 further comprises a first contact 51 and a second contact 52 for externally electrically contacting the optoelectronic semiconductor component. By applying an electric voltage between these contacts, charge carriers are injected into the active region 20 from different sides, recombining there along with the emission of radiation.

The semiconductor body 2 comprises a plurality of recesses 25 extending through the second semiconductor layer 22 and the active region into the first semiconductor layer 21. In the recesses 25, the first semiconductor layer 21 is electrically conductively connected to a first connection layer 31. The first connection layer 31 extends in some regions between the carrier 4 and the semiconductor body 2 in a vertical direction, i.e. perpendicularly to a main extension plane of the active region of the semiconductor body 2.

A radiation exit surface 11 of the semiconductor body 2 that faces away from the carrier 4 is free from an electrical contact. This prevents a shadowing of the radiation exit surface 11. In the shown exemplary embodiment, the first contact 51 is arranged on the rear side of the carrier 4 that faces away from the semiconductor body 2. In contrast, the first contact may also be arranged laterally with respect to the semiconductor body. In this case, the semiconductor component may provide both contacts required for the electrical contacting on its front side, i.e. at the side of the radiation exit surface 11.

Furthermore, the optoelectronic semiconductor component 1 comprises a second connection layer 32. The second connection layer 32 is electrically conductively connected to the second semiconductor layer 22 and extends, in some regions, between the semiconductor body 2 and the carrier 4. Furthermore, the second connection layer 32 extends, in a vertical direction, in some regions between the first connection layer 31 and the second semiconductor layer 22. Thus, in a plan view of the optoelectronic semiconductor component, the first connection layer 31 and the second connection layer 32 overlap in some regions.

The first connection layer and the second connection layer or a partial layer thereof may be made of metal. Furthermore, the second connection layer is formed as a mirror layer for the radiation generated in the active region.

In order to electrically insulate the first connection layer 31 from the second connection layer 32, an insulation layer 65 is arranged between these layers. The insulation layer 65 covers regions of the side surfaces of the recesses 25 such that the first connection layer 31 is electrically insulated from the active region 20 and the second semiconductor layer 22.

The second semiconductor layer 22 is electrically conductively connected to the second contact 51 via the second connection layer 32. The second contact 52 is arranged laterally with respect to the semiconductor body 2. In the shown exemplary embodiment, the second contact 52 extends along a side surface 26 of the semiconductor body that is closest to the contact. When electric voltage is applied between the first contact 51 and the second contact 52, charge carriers of one conductivity type are injected into the second semiconductor layer 22 from the second contact 52 via the second connection layer 32. In the plane of the second connection layer 32, a preferred lateral current direction 8 is generated, which extends perpendicularly to the side surface 26 of the semiconductor body 2.

The recesses 25 are formed to be elongate and have a maximum longitudinal extension 251 along a longitudinal extension axis 250. Perpendicularly thereto, the recesses 25 have a maximum transversal extension 252.

In the exemplary embodiment shown, the recesses are formed elliptically. However, in contrast, it is also possible to use a different elongated basic form, for example an oval basic form, a polygonal form such as a quadrangular or hexagonal basic form, or a polygonal basic form with rounded corners.

A ratio between the maximum longitudinal extension 251 and the maximum transversal extension 252 may preferably be between including 1.1:1 and including 10:1, for example between including 1.5:1 and including 8:1, for example between including 1.5:1 and including 3:1.

The maximum transversal extension is preferably between including 10 μm and including 80 μm. The maximum longitudinal extension is preferably between including 15 μm and including 100 μm.

The longitudinal extension axis 250 extends parallel to the preferred current direction 8. However, the longitudinal extension axis 250 and the preferred current direction 8 may include an angle of at most 20°, preferably at most 10°.

The recesses 25 are arranged on intersection points 70 of first straight lines 71 running parallel to one other and second straight lines 72 running parallel to one other. The position of the recesses 25 refers to their centers of area, respectively. The first straight lines 71 extend equidistantly at a first distance 75. The second straight lines 72 extend equidistantly at a second distance 76. The first distance 75 is greater than the second distance 76. For example, the first distance 75 is at least 1.1 times greater than the second distance 76.

The first straight lines 71 run at a greater angle relative to the longitudinal extension axis 250 than the second straight lines. In FIG. 1A, the first straight lines run perpendicularly to the longitudinal extension axis and perpendicularly to the preferred current direction 8. However, the first straight lines may also extend at an angle different from 90° relative to the longitudinal extension axis and/or relative to the preferred current direction. For example, the angle is between including 75° and including 90°.

The recesses 25 are arranged in a hexagonal lattice. In the exemplary embodiment shown, an angle 79 between the first straight lines 71 and the second straight lines 72 is greater than 60° such that the hexagonal lattice is stretched along the longitudinal extension axis 250.

In contrast, however, the angle may also be exactly 60° such that a regular hexagonal lattice results. Furthermore, the angle may also be smaller than 60°, resulting in a lattice compressed along the longitudinal extension axis 250.

Preferably, the angle 79 between the first straight lines and the second straight lines is between including 40° and including 90°. In particular, the angle is preferably between including 50° and including 80°.

In a regular hexagonal lattice, i.e. at an angle of 60°, a distance of any point in the lateral plane of the semiconductor body to the center point of the closest recess is minimal.

In a hexagonal lattice stretched along the longitudinal extension axis, the overall number of recesses 25 provided per area of the semiconductor body is reduced. This increases the overall area of the second semiconductor layer 22 that can be contacted by the second connection layer 32. Furthermore, the area of the active region 20 that can be used for generating radiation is increased.

In a compressed hexagonal lattice, the distance to the closest recess can be further minimized.

In the exemplary embodiment shown, the first straight lines 71 extend perpendicularly to the preferred lateral current direction 8. The preferred lateral current direction 8 and the longitudinal extension axis 250 may, however, also include a small angle with respect to one another, for example an angle of 20° at the most.

Along the first straight lines 71, the recesses 25 have a first outer distance 77. The first outer distance 77 is larger than a second outer distance 78 along the second straight lines 72.

The elongated design of the recesses 25 allows maximizing the first outer distance 77, which is relevant for the current flow along the preferred lateral current direction 8 in the second connection layer 32 such that the injection of charge carriers into the second semiconductor layer 22 is promoted. The product of the sum of the first outer distances 77 along a first straight line 71 and the layer thickness of the second connection layer yields the minimum cross-sectional area for a lateral current flow along the preferred current direction. Compared to circular recesses, the minimum cross-sectional area is increased, allowing for the injection of greater currents via the second connection layer 32.

Furthermore, the area of the recesses 25 and thus the area of the recesses 25 that can be used for electrically contacting the first semiconductor layer 21 can be increased via the maximum longitudinal extension 251. Thus, the elongated designs of the recesses allow achieving efficient charge carrier injection for both polarities, i.e. electrons and holes.

The position and size of the areas that can be used for charge carrier injection of charge carriers of different polarities can be adapted to one other and, at the same time, be designed efficiently such that an efficient injection can be achieved for both polarities, via the ratio of the maximum longitudinal extension 251 to the maximum transversal extension 252, the distances of the first straight lines 71 and the second straight lines 72 as well as the angles 79 between the straight lines.

For example, the first outer distance along the first straight lines 71 is between including 0.2 and including five times, for example between including 0.5 times and including three times, the maximum transversal extension of the recesses.

The maximum longitudinal extension 251 is, for example, between including 0.2 times and including 0.84 times the first distance of the first straight lines 71.

In the exemplary embodiment, the centers of area of the recesses 25 are each positioned exactly on the intersection points 70 of the first straight lines 71 and the second straight lines 72. The recesses 25 may, of course, also be arranged slightly differently. Preferably, the recesses 25 at least overlap with the intersection points 70 in a plan view of that semiconductor component 1.

The second exemplary embodiment shown in FIG. 2 substantially corresponds to the first exemplary embodiment described with reference to FIGS. 1A and 1B. In particular, the semiconductor component may be designed, in a cross-sectional view, as described with reference to FIGS. 1A and 1B.

In contrast to the first exemplary embodiment, an angle 79 between the first straight lines 71 and the second straight lines 72 is 90°. Thus, the recesses 25 are arranged in an orthogonal lattice. An especially efficient charge carrier injection can be achieved for both polarities due to the elongated design of the recesses 25 even in an orthogonal lattice. In contrast to elongated recesses 25, circular recesses 25, when viewed in a plan view of the semiconductor component, of the same size would cause a stronger obstruction of the lateral current flow in the second connection layer 32 along the preferred lateral current direction 8.

This patent application claims the priority of the German patent application 10 2014 112 562.2, the disclosure of which is incorporated herein by reference.

The invention described herein is not limited by the description of the exemplary embodiments. The invention rather includes each new feature as well as each combination of features, in particular any combination of features in the claims, even though the respective feature or combination per se may not explicitly be specified in the claims or exemplary embodiments.

The invention claimed is:

1. An optoelectronic semiconductor component with a semiconductor body, which comprises a semiconductor layer sequence with an active region provided for generation of radiation, a first semiconductor layer and a second semiconductor layer, wherein the active region is arranged between the first semiconductor layer and the second semiconductor layer, wherein the semiconductor body comprises a plurality of recesses extending through the second semiconductor layer and the active region, wherein the recesses are arranged on intersection points of first straight lines, which extend parallel to one another along a first direction, and second straight lines, which extend parallel to one another along a second direction, wherein the first straight lines run equidistantly at a first distance to one another, wherein the second straight lines run equidistantly at a second distance to one another, wherein the first distance is at least 1.1 times greater than the second distance, wherein the first straight lines run at a larger angle to a longitudinal extension axis than the second straight lines and an angle between the first straight lines and the second straight lines is between 50° and 80°, inclusive, and wherein in a plan view of the semiconductor body, the recesses are formed elongated with the longitudinal extension axis.

2. The optoelectronic semiconductor component according to claim 1, wherein the recesses have, along the longitudinal extension axis, a maximum longitudinal extension and perpendicularly thereto a maximum transversal extension, and wherein a ratio of the maximum longitudinal extension to the maximum transversal extension is between including 1.1:1 and 10:1.

3. The optoelectronic semiconductor component according to claim 1, wherein the semiconductor component comprises a first connection layer, which is guided through the recesses and which is electrically conductively connected to the first semiconductor layer, wherein the semiconductor component comprises a second connection layer, which is electrically conductively connected to the second semiconductor layer, and wherein a preferred lateral current direction runs parallel to the longitudinal extension axis in the second connection layer.

4. The optoelectronic semiconductor component according to claim 3, wherein the semiconductor component comprises a carrier having the semiconductor body arranged thereon, and wherein the first connection layer extends between the semiconductor body and the carrier in some regions.

5. The optoelectronic semiconductor component according to claim 1, wherein a first outer distance between neighboring recesses along the first direction is greater than a second outer distance along the second direction.

6. The optoelectronic semiconductor component according to claim 1, wherein the semiconductor component comprises a first connection layer, which is guided through the recesses and which is electrically conductively connected to the first semiconductor layer, wherein the semiconductor component comprises a second connection layer, which is electrically conductively connected to the second semiconductor layer, wherein a preferred lateral current direction extends parallel to the longitudinal extension axis in the second connection layer, wherein the semiconductor body is arranged on a carrier of the semiconductor component and the first connection layer extends between the semiconductor body and the carrier in some regions, and wherein the recesses are arranged in a hexagonal lattice stretched along the longitudinal extension axis.

7. The optoelectronic semiconductor component according to claim 1, wherein the angle between the first straight lines and the second straight lines is between including 60° and 80°.

8. The optoelectronic semiconductor component according to claim 1, wherein the recesses are arranged in a non-orthogonal lattice.

9. The optoelectronic semiconductor component according to claim 1, wherein a first outer distance between recesses along the first straight lines is between including 0.2 and including five times a maximum transversal extension of the recesses.

10. An optoelectronic semiconductor component with a semiconductor body, which comprises a semiconductor layer sequence with an active region provided for generation of radiation, a first semiconductor layer and a second semiconductor layer, wherein the active region is arranged between the first semiconductor layer and the second semiconductor layer, wherein the semiconductor body comprises a plurality of recesses extending through the second semiconductor layer and the active region, wherein the recesses are arranged on intersection points of first straight lines, which extend parallel to one another along a first direction, and second straight lines, which extend parallel to one another along a second direction, wherein the first straight lines run equidistantly at a first distance to one another, wherein the second straight lines run equidistantly at a second distance to one another, wherein the first distance is at least 1.1 times greater than the second distance, wherein the first straight lines run at a larger angle to a longitudinal extension axis than the second straight lines and an angle between the first straight lines and the second straight lines is between 60° and 80°, inclusive, and wherein in a plan view of the semiconductor body, the recesses are formed elongated with the longitudinal extension axis.

11. The optoelectronic semiconductor component according to claim 10, wherein a first outer distance between neighboring recesses along the first direction is greater than a second outer distance between neighboring recesses along the second direction, so that a lateral current injection into the second semiconductor layer along a preferred current direction is promoted.

12. The optoelectronic semiconductor component according to claim 10, wherein for promoting an efficient charge carrier injection for both polarities, a first outer distance between neighboring recesses along the first direction is between including 0.2 times and including five times a maximum transversal extension of the recesses.

13. The optoelectronic semiconductor component according to claim 10, wherein for promoting an efficient charge carrier injection for both polarities, a first outer distance between neighboring recesses along the first direction is between including 0.5 times and including three times a maximum transversal extension of the recesses.

* * * * *